(12) United States Patent
Felps et al.

(10) Patent No.: US 6,351,112 B1
(45) Date of Patent: *Feb. 26, 2002

(54) CALIBRATING COMBINATIONS OF PROBES AND CHANNELS IN AN OSCILLOSCOPE

(75) Inventors: Jimmie D. Felps, Colorado Springs, CO (US); Brian L. Richardson, deceased, late of Port Richey, FL (US), by Marion Richardson, executrix; Gerald R. Kinsley, Colorado Springs, CO (US)

(73) Assignee: Agilent Technologies, Inc., Palo Alto, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/143,590

(22) Filed: Aug. 31, 1998

(51) Int. Cl.[7] ............................................. G01R 31/02
(52) U.S. Cl. .................... 324/72.5; 324/754; 324/158.1
(58) Field of Search ............................... 324/72.5, 754, 324/158.1

(56) References Cited

U.S. PATENT DOCUMENTS

| | | | | |
|---|---|---|---|---|
| 3,903,471 A | * | 9/1975 | Hiraga et al. | 361/189 |
| 3,944,921 A | * | 3/1976 | Tsuda et al. | 324/72.5 |
| 4,042,881 A | * | 8/1977 | Webb, Jr. | 324/72.5 |
| 4,139,817 A | * | 2/1979 | Boer et al. | 324/72.5 |
| 4,403,183 A | * | 9/1983 | Lueker | 324/72.5 |
| 4,634,971 A | * | 1/1987 | Johnson et al. | 324/72.5 |
| 4,672,306 A | * | 6/1987 | Thong | 324/72.5 |
| 4,758,779 A | * | 7/1988 | Thong | 324/72.5 |
| 4,764,879 A | * | 8/1988 | Campbell | 702/92 |
| 5,162,725 A | * | 11/1992 | Hodson et al. | 324/115 |
| 5,629,617 A | * | 5/1997 | Uhling et al. | 324/158.1 |
| 5,691,635 A | * | 11/1997 | Pot et al. | 324/115 |

FOREIGN PATENT DOCUMENTS

| | | | | |
|---|---|---|---|---|
| DE | 19723050 A1 | 2/1998 | | H01R/13/639 |
| EP | 0 201 181 A1 | 3/1986 | | G06F/11/26 |
| EP | 0 786 647 A1 | 12/1996 | | G01D/3/02 |
| GB | 2 323 488 A | 3/1998 | | G01R/1/04 |

* cited by examiner

Primary Examiner—Safet Metjahic
Assistant Examiner—Jermele M. Hollington

(57) ABSTRACT

An electrical probe is provided for use with an electrical instrument, such as an oscilloscope. The probe includes a probe body, a sensing element affixed to the probe body for sensing an electrical parameter and a storage device containing probe information that uniquely identifies the probe. The probe information is electronically transferred from the storage device to the electrical instrument when the probe is connected to the electrical instrument. The electrical instrument stores calibration information that is associated with the probe. The electrical instrument uses the probe information received from the storage device in the probe to access the associated calibration information. The accessed calibration information is used to calibrate measurements made with the probe.

18 Claims, 5 Drawing Sheets

| PROBE ID | CHANNEL | CALIBRATION INFO |
|----------|---------|------------------|
| 1 | A | CALIB. 1A |
| 1 | B | EMPTY |
| 2 | A | CALIB. 2A |
| 2 | B | CALIB. 2B |
| ⋮ | ⋮ | ⋮ |

MFR: Hewlett Packard
MODEL #: HP1197A
SERIAL #: 1000000001

BW: 500 MHz
Input R: 1 Megohm
Input C: 1.0 pF (typ)

Risetime: 700 psec (calc)
Input Volt Range: +/- 20 volts
Max Input Volt: +/- 100 volts pk Calculated System BW: 354 MHz

Fig. 4

CALIBRATING COMBINATIONS OF PROBES AND CHANNELS IN AN OSCILLOSCOPE

FIELD OF THE INVENTION

This invention relates to electrical probes that are used with oscilloscopes and other electrical instruments and, more particularly, to an electrical probe having stored probe identification information.

BACKGROUND OF THE INVENTION

Oscilloscopes, voltmeters and other electrical instruments utilize a probe for sensing waveforms, voltages and the like. The probe is typically a small handheld assembly having an electrical sensing element. The probe is connected by a flexible cable and a connector to the oscilloscope or other instrument. In use, the sensing element is placed in contact with a node in an electrical circuit. A sensed parameter, such as a signal, a voltage or a waveform, is transmitted from the sensing element to the instrument for measurement and/or display.

The probe is detachably connected to the oscilloscope or other electrical instrument. This permits probes with different characteristics to be utilized in different applications. Furthermore, the probe may be removed from the oscilloscope if either the probe or the oscilloscope is malfunctioning. In addition, oscilloscopes typically have two or more channels, and a probe may be moved from one channel to another for various reasons. In general, oscilloscope probes may be frequently connected to and disconnected from oscilloscopes.

Oscilloscope probes of different types and different manufacturers have different parameters, such as capacitance, frequency response and the like. Furthermore, probes of a given model number may have different parameters due to component tolerances and manufacturing variations. In addition, different oscilloscope channels have different characteristics, even if they are intended to be identical, due to component tolerances and manufacturing variations. Accordingly, it is necessary to calibrate a particular combination of oscilloscope probe and oscilloscope channel to obtain high measurement accuracy.

One straightforward approach is to perform a calibration routine each time a probe is connected to the oscilloscope. This ensures accuracy but may be inconvenient and time-consuming if the probe is frequently disconnected from the oscilloscope.

Another approach is to store calibration information for the probe in the probe and to transmit the cation information to the oscilloscope when the probe is connected. This approach has the advantage that the calibration information remains with the probe at all times, but does not take into account the fact that different oscilloscope channels have different characteristics. Accordingly, a probe that is calibrated on one oscilloscope channel may not provide high accuracy measurements when the probe is connected to another channel of the same oscilloscope or to a different oscilloscope. Furthermore, the volume of calibration information may be high, making storage of the information in the probe inconvenient and expensive.

Accordingly, there is a need for improved probe configurations which overcome one or more of the above disadvantages and drawbacks.

SUMMARY OF THE INVENTION

According to a first aspect of the invention, an electrical probe is provided for use with an electrical instrument. The probe comprises a probe body, a sensing element affixed to the probe body for sensing an electrical parameter, and a storage device containing probe information that uniquely identifies the probe. The probe further comprises a connector for detachably connecting the probe to the electrical instrument and an electrical circuit for electronically transferring the probe information from the storage device to the electrical instrument. The electrical instrument may comprise an oscilloscope.

The storage device may comprise a read-only memory and preferably comprises an electrically-programmable read-only memory. The probe information contained in the storage device may comprise a model number and a serial number of the probe. The probe information may further comprise probe setup information.

The electrical circuit may comprise means for serially transmitting the probe information from the storage device to the electrical instrument. The probe information may be read from the storage device in response to control signals from the electrical instrument.

According to another aspect of the invention, measurement apparatus includes an electrical instrument and an electrical probe that is detachably connected to the electrical instrument. The probe comprises a probe body, a sensing element for sensing an electrical parameter and a storage device containing probe information that uniquely identifies the probe. The electrical instrument processes the electrical parameter sensed by the sensing element. The electrical instrument comprises means for storing calibration information that is associated with the probe, means for reading the probe information from the storage device in the probe, and means responsive to the probe information for applying the associated calibration information to processing of the electrical parameter. The electrical instrument may comprise an oscilloscope.

According to a further aspect of the invention, a method is provided for calibrating an electrical probe that is detachably connected to an electrical instrument. The method comprises the steps of storing in the probe a probe ID that uniquely identifies the probe, storing in the electrical instrument calibration information that is associated with the probe, electronically transferring the probe ID from the probe to the electrical instrument, using the probe ID to access the associated calibration information, and applying the accessed calibration information to signals measured with the probe.

BRIEF DESCRIPTION OF THE DRAWINGS

For a better understanding of the present invention, reference is made to the accompanying drawings, which are incorporated herein by reference and in which:

FIG. 2 illustrates an example of the calibration memory organization;

FIG. 4 shows an example of an optional probe information display window.

DETAILED DESCRIPTION

Figure 1:
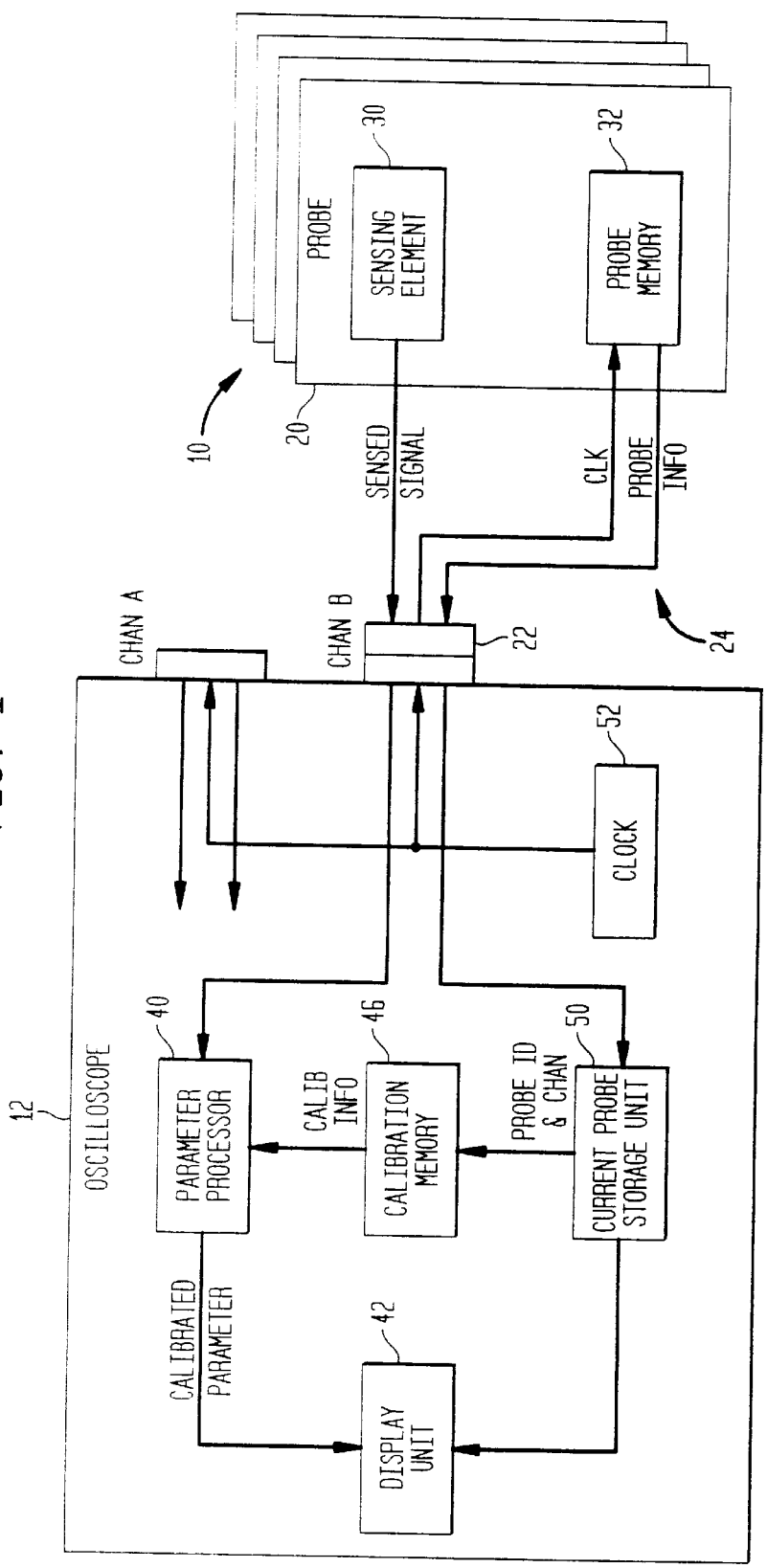
FIG. 1 is a simplified block diagram of an oscilloscope connected to one of a plurality of electrical probes, showing an example of the present invention.

A simplified block diagram of an example of an oscilloscope system incorporating the present invention is shown in FIG. 1. One of a plurality of oscilloscope probes 10 is connected to channel B of an oscilloscope 12 or other electrical instrument.

Probe 10 includes a probe body 20, a connector 22 for attachment to oscilloscope 12, and a cable 24 that interconnects probe body 20 and connector 22. A sensing element 30 and a probe memory 32 are mounted in probe body 20. Sensing element 30 may be a conductive probe tip that is connected, either directly or indirectly through interface circuitry, to oscilloscope 12. Probe memory 32 contains probe information that is electronically transferred to oscilloscope 12, as described in detail below.

Probe 10 is configured for manual operation. As well known in the art, sensing element 30 is placed in electrical contact with a node of interest in an electrical circuit. A sensed signal is transmitted from sensing element 30 through cable 24 to oscilloscope 12 and is measured and/or displayed by oscilloscope 12. In some cases, the sensed signal may be preprocessed by circuitry within probe 10. Probe 10 is easily detachable from oscilloscope 12.

As shown in FIG. 1, oscilloscope 12 may include channel A and channel B, either or both of which may be connected to a probe. Each channel may include independent circuitry for processing sensed signals and forwarding the processed signals to a display unit or other indicating device. It will be understood that the oscilloscope may include a single channel or more than two channels within the scope of the invention. For simplicity, only those components that are relevant to the present invention are shown in FIG. 1. Oscilloscope 12 includes a parameter processor 40 for processing sensed signals, a display unit 42 for displaying parameter information and all other information associated with operation of oscilloscope 12, a calibration memory 46 for storing calibration information for one or more probes, a current probe storage unit 50 for storing identifying information for a probe currently connected to oscilloscope 12, and a clock 52 for providing timing signals to the circuitry in oscilloscope 12 and to probe memory 32 in probe 10. The parameter processor 40 may, for example, measure the sensed signal and/or may amplify the sensed signal to provide a waveform display. The calibration memory 46 and the current probe storage unit 50 may be implemented as RAM, hard disk or any other suitable storage device. Furthermore, these may be separate storage devices or different sections of one storage device.

In accordance with a feature of the invention, probe memory 32 contains probe information that uniquely identifies probe assembly 10. For example, probe memory 32 may contain a model number and a serial number, and any other information or parameters required to uniquely identify probe 10. Probe memory 32 may contain additional information that may be useful in the operation of the oscilloscope system. The information contained in probe memory 32 may be electronically transmitted to oscilloscope 12 and may be used by oscilloscope 12 as described below. Preferably, probe memory 32 is read by oscilloscope 12 following connection of probe 10 to oscilloscope 12. A serial data link is preferably utilized to provide a simple interface between probe 10 and oscilloscope 12.

The following is an example of the probe information that may be contained in probe memory 32. It will be understood that different probe information content and formats may be utilized within the scope of the invention.

1. The record length may be specified by two bytes.
2. A two byte checksum field may be used to record a checksum number. All data bytes beginning with the byte following the checksum number through the end of the record are added. The sum is recorded in the checksum field. The oscilloscope performs the same operation when reading the probe memory and compares the result with the checksum number received from the probe. When the numbers are the same, a valid read is verified.
3. One byte may be utilized to indicate hardware revision number.
4. One byte may be utilized to indicate software revision number.
5. One or more bytes may contain probe setup information, such as attenuation units (decibels or ratio), low frequency reject (LFR) offset calibration required (yes or no), coupling modes (DC only; DC plus LFR; or DC, LFR1 and LFR2), offset polarity inverted (yes or no), offset feature (yes or no), scope input resistance (1 megohm or 50 ohms), probe setup information contained in probe (yes or no), identification of a calibration routine, and units of measure (volts, watts or amperes).

The probe information may further include a number of ASCII character strings. Each ASCII character string may end with one byte that is a stop byte of all zeros. The following are examples of ASCII character strings that may be contained in the probe memory 32.

String 1: Low frequency reject frequency (AC, LFR or LFR1). An example is LFR1=1.7 Hz. String 1may include up to 15

String 2: Low frequency reject frequency 2 (LFR2). An example is LFR2=0.14 Hz. String 2 may include up to 15 ASCII characters.

String 3: Attenuation factor. An example is 1000:1. String 3 may include up to 7 ASCII characters.

String 4: Offset voltage range. An example is 1000. String 4 may include up to 5 ASCII characters.

String 5: Nominal percentage of autoprobe offset current that causes a full scale offset on the probe. An example is 85. String 5 may include up to 2 ASCII characters.

String 6: Probe manufacturer. An example is Hewlett-Packard. String 6 may include up to 20 ASCII characters.

String 7: Probe model number. An example is HP1197A. String 7 may include up to 15ASCII characters.

String 8: Probe serial number. String number 8 may include up to 10 ASCII characters.

String 9: Probe bandwidth. An example is 500 MHz. String 9 may include up to 10 ASCII characters.

String 10: Input resistance. An example is 1Megohm. String 10 may include up to 11 ASCII characters.

String 11: Input capacitance. An example is 1.0 picofarad. String 11 may include up to 17 ASCII characters.

String 12: Risetime. An example is 700 picoseconds.

String 13: Input voltage range. An example is +/−20 volts.

String 14: Maximum input voltage. An example is +/−100 volts peak.

Strings 12–14 contain optional information of up to 30 ASCII characters each. Additional information listed above may be optional in certain applications. The volume of information is limited by the capacity of the probe memory 32.

In the example given above, the probe model number and probe serial number may constitute a probe ID that uniquely identifies the probe 10 attached to channel B of oscilloscope 12. The probe information read from probe memory 32 may be stored in current probe storage unit 50 in oscilloscope 12. The probe ID and channel are used to address calibration memory 46. More particularly, calibration memory 46 may include calibration information for each probe that has been calibrated on each channel of the oscilloscope. As indicated above, different channels of the oscilloscope 12 may require different calibration data due to differences between channels. Thus, a particular probe may have different calibration information for channels A and B.

An example of a suitable organization for calibration memory 46 is shown in FIG. 2. Calibration information is classified and addressed according to probe ID and channel. Thus, for example, when probe 2 is connected to channel B, calibration information 2B is accessed in calibration memory 46 and is supplied to parameter processor 40 for calibration of measurements by probe 2 on channel B. If probe 2 is connected to channel A, calibration information 2A is accessed in calibration memory 46. It may be observed that calibration memory 46 does not include calibration information for probe 1 connected to channel B, because probe 1 has not been calibrated on channel B.

The calibration information contained in calibration memory 46 is acquired in a calibration procedure for each probe and channel combination. The calibration procedure is typically performed when a probe is first connected to a particular channel of the oscilloscope. Thus, for example, when probe 1 is connected to channel B of oscilloscope 12, a calibration procedure is performed and calibration information 1B is stored in calibration memory 46. The calibration information is retained in calibration memory 46 until it is deleted, for example, because the probe is no longer being used. The calibration information may include gain and offset correction factors. Typically, oscilloscope 12 has a large capacity storage, such as a hard disk, and may store a relatively large volume of calibration information.

Figure 3:
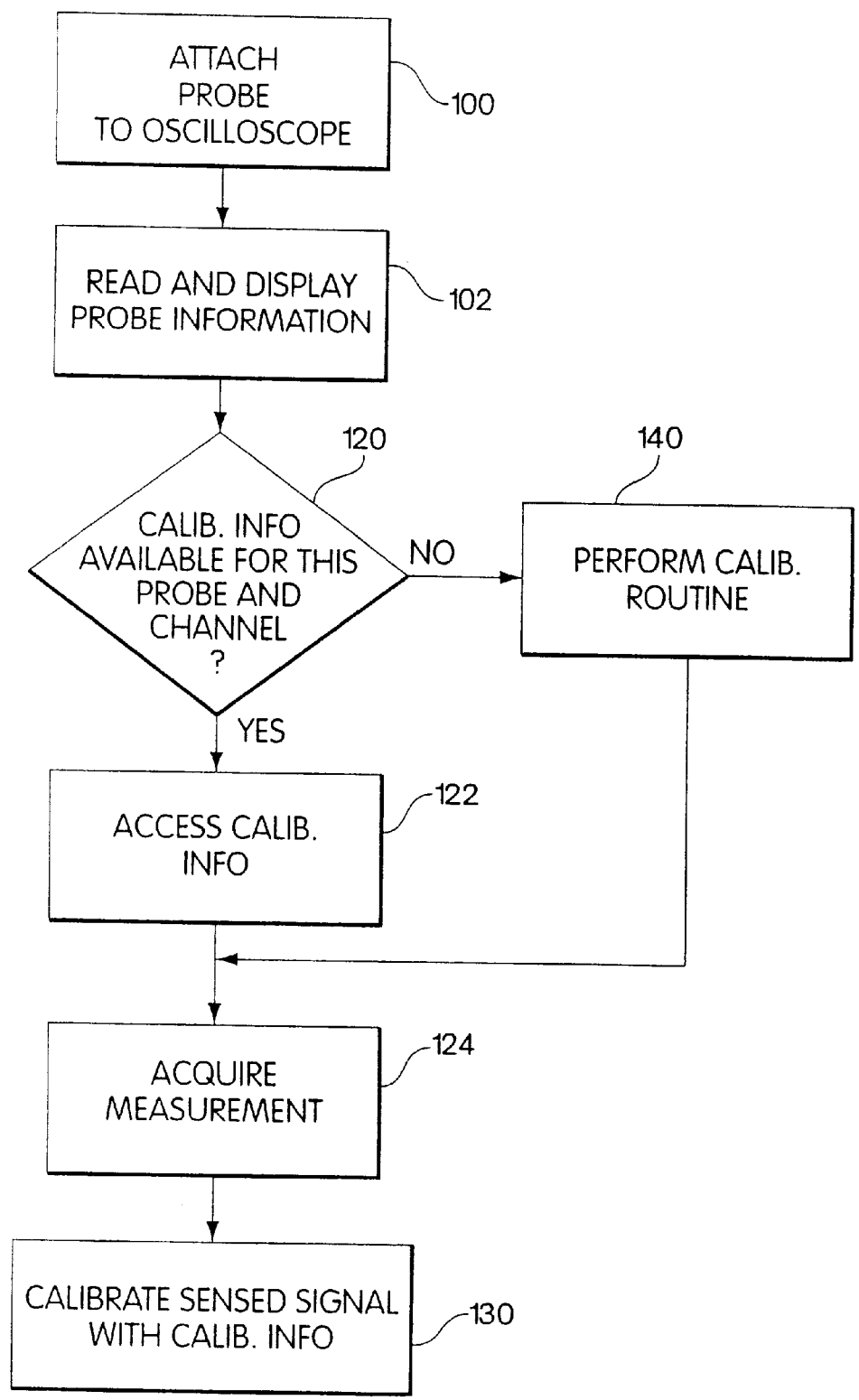
FIG. 3 is a flow chart showing an example of a routine for utilizing probe information in accordance with the invention.

A flow chart of an example of a process for utilization of the probe information contained in probe memory 32 is shown in FIG. 3. A probe is connected to oscilloscope 12 (FIG. 1) in step 100. The probe may be any model number and serial number that is compatible with the oscilloscope. Initially, the oscilloscope has no information as to the probe ID of the probe that is connected to the oscilloscope. In step 102, oscilloscope 12 reads the probe information contained in probe memory 32 and stores the probe information in current probe storage unit 50.

Optionally, all or a subset of the probe information may be displayed in a probe information window on display unit 42. An example of a suitable probe information window 110 is shown in FIG. 4. The probe information window 110 may include the manufacturer, model number and serial number of the probe assembly, as well as any other parameters of interest.

Referring again to FIG. 3, a determination is made in step 120 as to whether calibration information is present in calibration memory 46 for the particular probe ID and channel combination. If the calibration information is available in calibration memory 46, the calibration information is accessed in step 122, and the accessed calibration information is supplied to parameter processor 40. At this time, the oscilloscope is ready to acquire a measurement in step 124. A sensed signal is supplied by sensing element 30 to parameter processor 40. The parameter processor 40 utilizes the sensed signal and the accessed calibration information from calibration memory 46 to provide a calibrated parameter or signal to display unit 42 in step 130. Because the calibration information is unique to the probe assembly and channel, the measurement is highly accurate.

When it is determined in step 120 that calibration information is not available in calibration memory for the particular combination of probe assembly and channel, a calibration routine is performed in step 140. The calibration routine is required when the particular probe has not previously been connected to the same channel of the oscilloscope. The calibration routine may prompt the user to perform any necessary calibration steps. Following the calibration routine, the calibration information is stored in calibration memory 46 for future use and is supplied to parameter processor 40 for use in the current measurement session. The process then proceeds to step 124 for acquiring a measurement as described above.

Figure 5:
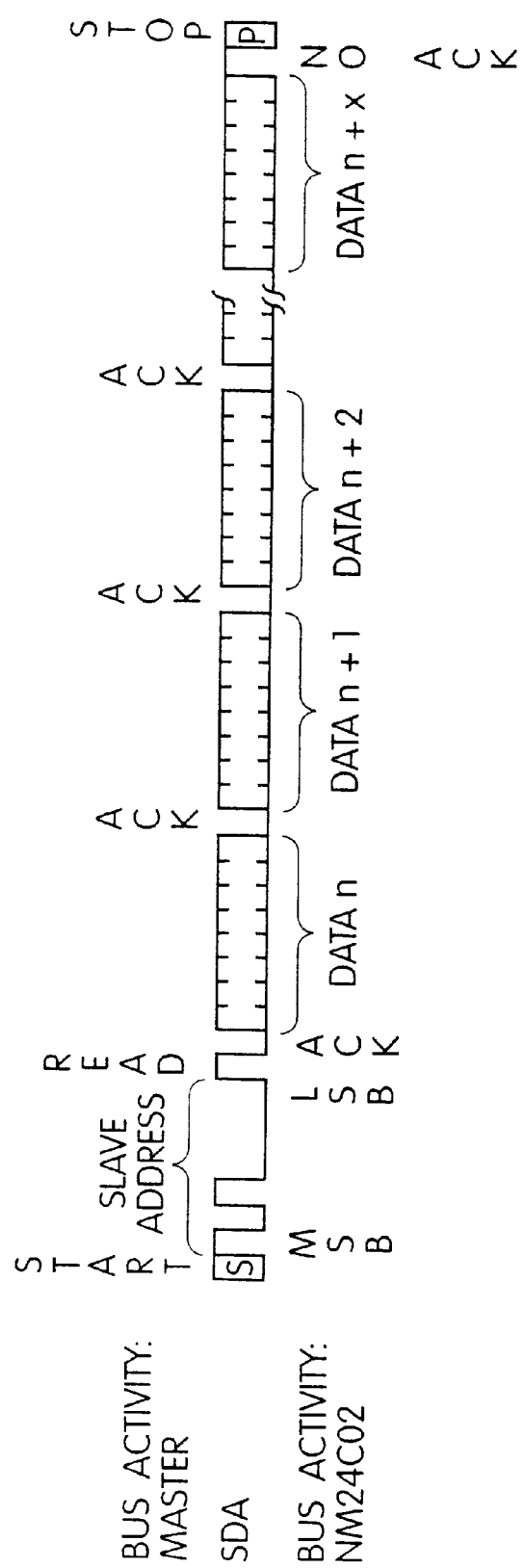
FIG. 5 is a timing diagram that illustrates an example of reading probe information in accordance with the invention.

The probe memory 32 may utilize any suitable storage device. The storage device should be small in size for convenient packaging in probe 10 and should be low in cost. In addition, the storage device should be easily read by oscilloscope 12 with a minimum of additional circuitry and conductors in cable 24. The probe memory 32 preferably comprises a read-only memory, and more preferably comprises an electrically erasable and programmable read-only memory. In one embodiment, probe memory 32 comprises a two-wire serial CMOS EEPROM, type AT24C02, manufactured and sold by Atmel. This device is organized into 256 8-bit bytes for a total of 2,048 bits. The device is supplied with a clock signal and has a bidirectional serial data line. The protocol for a sequential read is shown in FIG. 5. The oscilloscope supplies a slave address, and the memory device supplies a data word. The oscilloscope then provides an acknowledge, and the memory device supplies another data word. So long as the memory device receives acknowledge, it continues to increment the data word address and serially clock out sequential data words.

It will be understood that different memory devices and different quantities of probe information may be utilized within the scope of the present invention. The probe information may vary widely in content and format within the scope of the invention. The storage device is required to store sufficient probe information to uniquely identify the probe, thereby permitting the oscilloscope to access stored calibration information.

While there have been shown and described what are at present considered the preferred embodiments of the present invention, it will be obvious to those skilled in the art that various changes and modifications may be made therein without departing from the scope of the invention as defined by the appended claims.

What is claimed is:

1. Apparatus comprising:
   an electrical probe including,
      a probe body,
      a sensing element affixed to said probe body constructed and arranged to sense an electrical parameter, and
      a storage device containing probe information that uniquely identifies said probe; and
   an electrical instrument for processing the electrical parameter sensed by said sensing element, said probe detachably connected to one of a plurality of channels of said electrical instrument, said electrical instrument including,
      a calibration memory having stored therein calibration information associated with each of a plurality of combinations of electrical probes and instrument channels, and
      a current probe storage unit having said probe information stored therein, wherein said instrument utilizes calibration information retrieved from said calibration memory for the combination of said probe and said channel to which said probe is connected, when processing said sensed electrical parameter.

2. Apparatus as defined in claim 1 wherein said electrical instrument comprises:

an oscilloscope.

3. Apparatus as defined in claim 1 wherein said storage device comprises:

a read-only memory.

4. Apparatus as defined in claim 1 wherein said storage device comprises:

an electrically-programmable read-only memory.

5. Apparatus as defined in claim 1 wherein said probe information comprises:

a model number of said probe; and a serial number of said probe.

6. Apparatus as defined in claim 1 wherein said electrical instrument comprises:

means for displaying at least a portion of said probe information.

7. Apparatus as defined in claim 1 wherein said instrument is further constructed and arranged to automatically read said probe information following attachment of said probe to said electrical instrument.

8. Apparatus as defined in claim 1, wherein said probe further comprises:

a connector for detachably connecting the probe to the electrical instrument; and an electrical circuit for electronically transferring said probe information from said storage device to said electrical instrument.

9. Apparatus as defined in claim 8 wherein said electrical circuit comprises means for serially transmitting said probe information from said storage device to the electrical instrument.

10. A method for calibrating an electrical probe that is detachably connected to an electrical instrument, comprising the steps of:

storing in the probe a probe ID that uniquely identifies the probe;

storing in a calibration memory of the electrical instrument calibration information that is associated with the combination of the probe and a channel of the instrument to which the probe was connected when calibrated;

electronically transferring the probe ID from the probe to the electrical instrument;

retrieving said calibration information from said calibration memory based on said probe ID and said channel to which said probe is connected; and applying said retrieved calibration information to the processing signals measured with the probe.

11. A method as defined in claim 10 wherein the step of transferring the probe ID comprises reading the probe ID from a storage device in the probe.

12. A method as defined in claim 10 wherein the step of electronically transferring the probe ID is performed automatically following attachment of the probe to the instrument.

13. An electrical instrument for processing electrical parameters sensed by a sensing element of an electrical probe detachably connected to one of a plurality of channels of the electrical instrument, said electrical instrument including, a calibration memory having stored therein calibration information associated with each of a plurality of combinations of electrical probes and instrument channels; and a current probe storage unit containing probe information that uniquely identifies the probe, wherein said instrument retrieves calibration information from said calibration memory based on said probe unique identifier and said channel to which said probe is connected, and wherein said instrument applies said retrieved calibration information to the processing of said sensed electrical parameter.

14. The instrument as defined in claim 13 wherein said electrical instrument comprises:

an oscilloscope.

15. The instrument as defined in claim 13 wherein said probe information comprises:

a model number of said probe; and a serial number of said probe.

16. The instrument as defined in claim 13 wherein said electrical instrument comprises:

means for displaying at least a portion of said probe information.

17. The instrument as defined in claim 13 wherein the probe information is stored in a memory of the probe, and wherein said instrument is further constructed and arranged to automatically read said probe information following attachment of said probe to said electrical instrument.

18. The instrument as defined in claim 13, wherein said probe further comprises:

a connector for detachably connecting the probe to the electrical instrument; and an electrical circuit for electronically transferring said probe information from said storage device to said electrical instrument.

* * * * *